(12) United States Patent
Blakely et al.

(10) Patent No.: US 12,506,026 B2
(45) Date of Patent: Dec. 23, 2025

(54) MASS TRANSFER OF SEMICONDUCTOR DIE USING TRANSFER ELEMENTS

(71) Applicant: CreeLED, Inc., Durham, NC (US)

(72) Inventors: Colin Blakely, Raleigh, NC (US); Michael Check, Holly Springs, NC (US); Robert Wilcox, Rolesville, NC (US); David Suich, Durham, NC (US); Joseph G. Sokol, Durham, NC (US); Andre Pertuit, Raleigh, NC (US)

(73) Assignee: CreeLED, Inc., Durham, NC (US)

( * ) Notice: Subject to any disclaimer, the term of this patent is extended or adjusted under 35 U.S.C. 154(b) by 742 days.

(21) Appl. No.: 17/806,166

(22) Filed: Jun. 9, 2022

(65) Prior Publication Data

US 2023/0402310 A1    Dec. 14, 2023

(51) Int. Cl.
*H05K 3/20* (2006.01)
*H01L 21/683* (2006.01)
*H01L 25/075* (2006.01)
*H10H 20/857* (2025.01)
*H10H 20/01* (2025.01)

(52) U.S. Cl.
CPC ...... *H01L 21/6835* (2013.01); *H01L 25/0753* (2013.01); *H10H 20/857* (2025.01); *H01L 2221/68309* (2013.01); *H01L 2221/68354* (2013.01); *H01L 2221/68368* (2013.01); *H10H 20/0364* (2025.01)

(58) Field of Classification Search
CPC ....... H01L 25/0753; H01L 2221/68304; H01L 2221/68309; H01L 2221/68314; H01L 2221/6835; H01L 2221/68354; H01L 2221/68368; H10H 20/01; H10H 20/0364; H10H 20/857
See application file for complete search history.

(56) References Cited

U.S. PATENT DOCUMENTS

| | | | |
|---|---|---|---|
| 5,501,005 A * | 3/1996 | Onitsuka | B23P 19/001 29/721 |
| 6,651,800 B2 * | 11/2003 | Baclija | B65G 47/848 198/395 |
| 7,726,011 B2 * | 6/2010 | Bosch | H01L 21/67144 29/827 |
| 10,199,254 B2 * | 2/2019 | Stokkermans | H01L 21/6835 |
| 10,573,543 B2 | 2/2020 | Hussell et al. | |

* cited by examiner

*Primary Examiner* — Paul D Kim
(74) *Attorney, Agent, or Firm* — Withrow & Terranova, P.L.L.C.

(57) ABSTRACT

Methods and related systems for transfer of semiconductor die and more particularly for mass transfer of semiconductor die, such as light-emitting diodes, using transfer elements are disclosed. Certain aspects relate to methods of continuous mass transfer using roller feed loops. Two carrier bars move in opposite directions, one with die and one with a substrate. The die stick to a roller and transfer from a die carrier to the substrate on a substrate carrier. In certain aspects, transfer elements may include rollers, flexible rollers, or expandable rollers. Transfer elements may further include alignment features, such as alignment pockets, that provide enhanced die alignment. In certain aspects, transfer elements may include one or more planar surfaces that rotate positions relative to the die carrier and the substrate carrier.

22 Claims, 9 Drawing Sheets

MASS TRANSFER OF SEMICONDUCTOR DIE USING TRANSFER ELEMENTS

FIELD OF THE DISCLOSURE

The present disclosure relates to transfer of semiconductor die, and more particularly to mass transfer of semiconductor die, such as light-emitting diodes, using transfer elements.

BACKGROUND

During manufacturing, semiconductor die are often provided on die sheets that include larger quantities of individual die. During assembly of devices that incorporate the semiconductor die, it is necessary to transfer one or more of the semiconductor die from a die sheet. In the context of video screens or other display fixtures, multiple light-emitting diode (LED) chips, or LED die, that are provided on a die sheet require transfer to a substrate, board, and/or panel of the fixture. Transferring LED chips from a die sheet to a substrate can be slow and expensive by conventional techniques. For high-definition video or display applications, fixtures require millions of LED chips or die to function, and each LED needs to be moved onto the substrate (board, panel, etc.) in some fashion.

The art continues to seek improved semiconductor die transfer capable of overcoming challenges associated with conventional transfer techniques.

SUMMARY

The present disclosure relates to transfer of semiconductor die, and more particularly to mass transfer of semiconductor die, such as light-emitting diodes (LEDs), using transfer elements. Certain aspects relate to methods of continuous mass transfer and related systems using roller feed loops where transfer elements are provided as rollers. Two carrier bars move in opposite directions, one with die and one with a substrate. The die stick to the roller and transfer from a die carrier to the substrate on a substrate carrier. Roller speed can separate the die temporally into a lateral separation on the substrate (can load a diced wafer tape, for example). In certain aspects, transfer elements may include rollers, flexible rollers, or expandable rollers. Transfer elements may further include alignment features, such as alignment pockets, that provide enhanced die alignment. In certain aspects, transfer elements may include one or more planar surfaces that rotate positions relative to the die carrier and the substrate carrier.

In certain aspects, a method for transfer of semiconductor die comprises: providing a die carrier with a semiconductor die on a surface of the die carrier; providing a substrate carrier with a substrate on a surface of the substrate carrier; providing a transfer element between the die carrier and the substrate carrier; and transferring the semiconductor die from the die carrier to the substrate by rotating the transfer element such that the transfer element removes the semiconductor die from the die carrier, rotates the semiconductor die away from the die carrier, and transfers the semiconductor die to the substrate. In certain embodiments, the semiconductor die comprises an LED chip. In certain embodiments, the die carrier moves in a first direction relative to the transfer element and the substrate carrier moves in a second direction relative to the transfer element, wherein the first direction is opposite the second direction. In certain embodiments, the transfer element comprises a roller. In certain embodiments, the transfer element comprises a flexible roller. In certain embodiments, the transfer element comprises an expandable roller. In certain embodiments, the method further comprises applying a flux material to the transfer element before the semiconductor die is removed from the die carrier. In certain embodiments, the method further comprises applying a die release material to the transfer element before the semiconductor die is transferred to the substrate. In certain embodiments, the transfer element comprises a flat surface. In certain embodiments, the semiconductor die is one of a plurality of semiconductor die on the die carrier and the transfer element removes at least two semiconductor die at the same time. In certain embodiments, the transfer element comprises an alignment pocket and the semiconductor die resides within the alignment pocket after being removed from the die carrier. In certain embodiments, the transfer element comprises an ejector pin that releases the semiconductor die from the transfer element to the substrate.

In another aspect, a method for transfer of semiconductor die comprises: providing a die carrier with a plurality of semiconductor die on a surface of the die carrier; providing a substrate carrier with a substrate on a surface of the substrate carrier; providing a transfer element between the die carrier and the substrate carrier; and transferring the plurality of semiconductor die from the die carrier to the substrate by rotating the transfer element such that the transfer element removes the plurality of semiconductor die from the die carrier, rotates the plurality of semiconductor die away from the die carrier, and transfers the plurality of semiconductor die to the substrate. In certain embodiments, the transfer element removes certain semiconductor die of the plurality of semiconductor die from the die carrier in a sequential manner. In certain embodiments, the plurality of semiconductor die are arranged in subgroupings on the die carrier and the transfer element removes the subgroupings in a sequential manner. In certain embodiments, the subgroupings comprise patterns of the semiconductor die that are transferred from the die carrier to the substrate. In certain embodiments: the plurality of semiconductor die comprise LED chips; and each subgrouping comprises LED chips that emit different wavelengths from one another. In certain embodiments, the plurality of semiconductor die are arranged with a first pitch on the die carrier and the plurality of semiconductor die are transferred to the substrate with a second pitch that is different than the first pitch. In certain embodiments, the transfer element comprises a roller. In certain embodiments, the method further comprises applying a flux material to the transfer element after the plurality of semiconductor die are removed from the die carrier. The method may further comprise applying a die release material to the transfer element before the plurality of semiconductor die are removed from the die carrier. In certain embodiments, an adhesive strength between the die release material and the transfer element is less than an adhesive strength between the die and the substrate. In certain embodiments, the transfer element comprises a plurality of alignment pockets and at least one semiconductor die of the plurality of semiconductor die resides within each alignment pocket of the plurality of alignment pockets after being removed from the die carrier. In certain embodiments, the transfer element comprises one or more ejector pins that release the plurality of semiconductor die from the transfer element to the substrate.

In another aspect, any of the foregoing aspects individually or together, and/or various separate aspects and features as described herein, may be combined for additional advantage. Any of the various features and elements as disclosed herein may be combined with one or more other disclosed features and elements unless indicated to the contrary herein.

Those skilled in the art will appreciate the scope of the present disclosure and realize additional aspects thereof after reading the following detailed description of the preferred embodiments in association with the accompanying drawing figures.

BRIEF DESCRIPTION OF THE DRAWING FIGURES

The accompanying drawing figures incorporated in and forming a part of this specification illustrate several aspects of the disclosure, and together with the description serve to explain the principles of the disclosure.

DETAILED DESCRIPTION

The embodiments set forth below represent the necessary information to enable those skilled in the art to practice the embodiments and illustrate the best mode of practicing the embodiments. Upon reading the following description in light of the accompanying drawing figures, those skilled in the art will understand the concepts of the disclosure and will recognize applications of these concepts not particularly addressed herein. It should be understood that these concepts and applications fall within the scope of the disclosure and the accompanying claims.

It will be understood that, although the terms first, second, etc. may be used herein to describe various elements, these elements should not be limited by these terms. These terms are only used to distinguish one element from another. For example, a first element could be termed a second element, and, similarly, a second element could be termed a first element, without departing from the scope of the present disclosure. As used herein, the term "and/or" includes any and all combinations of one or more of the associated listed items.

It will be understood that when an element such as a layer, region, or substrate is referred to as being "on" or extending "onto" another element, it can be directly on or extend directly onto the other element or intervening elements may also be present. In contrast, when an element is referred to as being "directly on" or extending "directly onto" another element, there are no intervening elements present. Likewise, it will be understood that when an element such as a layer, region, or substrate is referred to as being "over" or extending "over" another element, it can be directly over or extend directly over the other element or intervening elements may also be present. In contrast, when an element is referred to as being "directly over" or extending "directly over" another element, there are no intervening elements present. It will also be understood that when an element is referred to as being "connected" or "coupled" to another element, it can be directly connected or coupled to the other element or intervening elements may be present. In contrast, when an element is referred to as being "directly connected" or "directly coupled" to another element, there are no intervening elements present.

Relative terms such as "below" or "above" or "upper" or "lower" or "horizontal" or "vertical" may be used herein to describe a relationship of one element, layer, or region to another element, layer, or region as illustrated in the Figures. It will be understood that these terms and those discussed above are intended to encompass different orientations of the device in addition to the orientation depicted in the Figures.

The terminology used herein is for the purpose of describing particular embodiments only and is not intended to be limiting of the disclosure. As used herein, the singular forms "a," "an," and "the" are intended to include the plural forms as well, unless the context clearly indicates otherwise. It will be further understood that the terms "comprises," "comprising," "includes," and/or "including" when used herein specify the presence of stated features, integers, steps, operations, elements, and/or components, but do not preclude the presence or addition of one or more other features, integers, steps, operations, elements, components, and/or groups thereof.

Unless otherwise defined, all terms (including technical and scientific terms) used herein have the same meaning as commonly understood by one of ordinary skill in the art to which this disclosure belongs. It will be further understood that terms used herein should be interpreted as having a meaning that is consistent with their meaning in the context of this specification and the relevant art and will not be interpreted in an idealized or overly formal sense unless expressly so defined herein.

Embodiments are described herein with reference to schematic illustrations of embodiments of the disclosure. As such, the actual dimensions of the layers and elements can be different, and variations from the shapes of the illustrations as a result, for example, of manufacturing techniques and/or tolerances, are expected. For example, a region illustrated or described as square or rectangular can have rounded or curved features, and regions shown as straight lines may have some irregularity. Thus, the regions illustrated in the figures are schematic and their shapes are not intended to illustrate the precise shape of a region of a device and are not intended to limit the scope of the disclosure. Additionally, sizes of structures or regions may be exaggerated relative to other structures or regions for illustrative purposes and, thus, are provided to illustrate the general structures of the present subject matter and may or may not be drawn to scale. Common elements between figures may be shown herein with common element numbers and may not be subsequently re-described.

The present disclosure relates to transfer of semiconductor die, and more particularly to mass transfer of semiconductor die, such as light-emitting diodes (LEDs), using transfer elements. Certain aspects relate to methods of continuous mass transfer and related systems using roller feed loops where transfer elements are provided as rollers. Two carrier bars move in opposite directions, one with die and one with a substrate. The die stick to the roller and transfer from a die carrier to the substrate on a substrate carrier. Roller speed can separate the die temporally into a lateral separation on the substrate (can load a diced wafer tape, for example). In certain aspects, transfer elements may include rollers, flexible rollers, or expandable rollers. Transfer elements may further include alignment features, such as alignment pockets, that provide enhanced die alignment. In certain aspects, transfer elements may include one or more planar surfaces that rotate positions relative to the die carrier and the substrate carrier.

Conventional LEDs are typically placed using pick and place collets or mass transfer stamps. Pick and place collets typically transfer a single die or groups of die at a time while mass transfer stamps may allow larger numbers of die to transfer at a time. Both of these methods require the die to be placed with a known spacing and pattern that matches the substrate beforehand. Such methods can prove challenging and be associated with increased costs, particularly as resolutions for display devices continue to require smaller LED die with closer spacings.

According to aspects of the present disclosure, methods are disclosed that allow a roller to pick up LED die from a singulated (non-stretched or non-spaced) state. With such an approach, changing the roller speed may provide any various placement of LED die in a grid array. This method allows for multiple colors or types of LED die to be fed into the die carrier because placement is dictated by speed. The roller and both carriers can be on different x/y stages, so the placement can vary laterally and longitudinally. As used herein, the terms LED die and LED chip may be used interchangeably.

The principles of the present disclosure are applicable to many different types of LED die that are configured to emit different wavelengths of light. In certain embodiments, LED die may be configured to emit blue light with a peak wavelength range of approximately 430 nanometers (nm) to 480 nm. In other embodiments, LED die may be configured to emit green light with a peak wavelength range of 500 nm to 570 nm. In other embodiments, LED die may be configured to emit orange and/or red light with a peak wavelength range of 600 nm to 700 nm. In certain embodiments, LED die may be configured to emit light that is outside the visible spectrum, including one or more portions of the ultraviolet (UV) spectrum, the infrared (IR) or near-IR spectrum. The UV spectrum is typically divided into three wavelength range categories denoted with letters A, B, and C. In this manner, UV-A light is typically defined as a peak wavelength range from 315 nm to 400 nm, UV-B is typically defined as a peak wavelength range from 280 nm to 315 nm, and UV-C is typically defined as a peak wavelength range from 100 nm to 280 nm. UV LEDs are of particular interest for use in applications related to the disinfection of microorganisms in air, water, and surfaces, among others. In other applications, UV LEDs may also be provided with one or more lumiphoric materials to provide LED packages with aggregated emissions having a broad spectrum and improved color quality for visible light applications. Near-IR and/or IR wavelengths for LED structures of the present disclosure may have wavelengths above 700 nm, such as in a range from 700 nm to 1000 nm, or more. The principles of the present disclosure are applicable to transferring all LED die of a common peak wavelength or transferring combinations of LED die according to any of the wavelength ranges described above. For example, arrays of LED die may be transferred that collectively emit red, green, and blue light.

Figure 1:
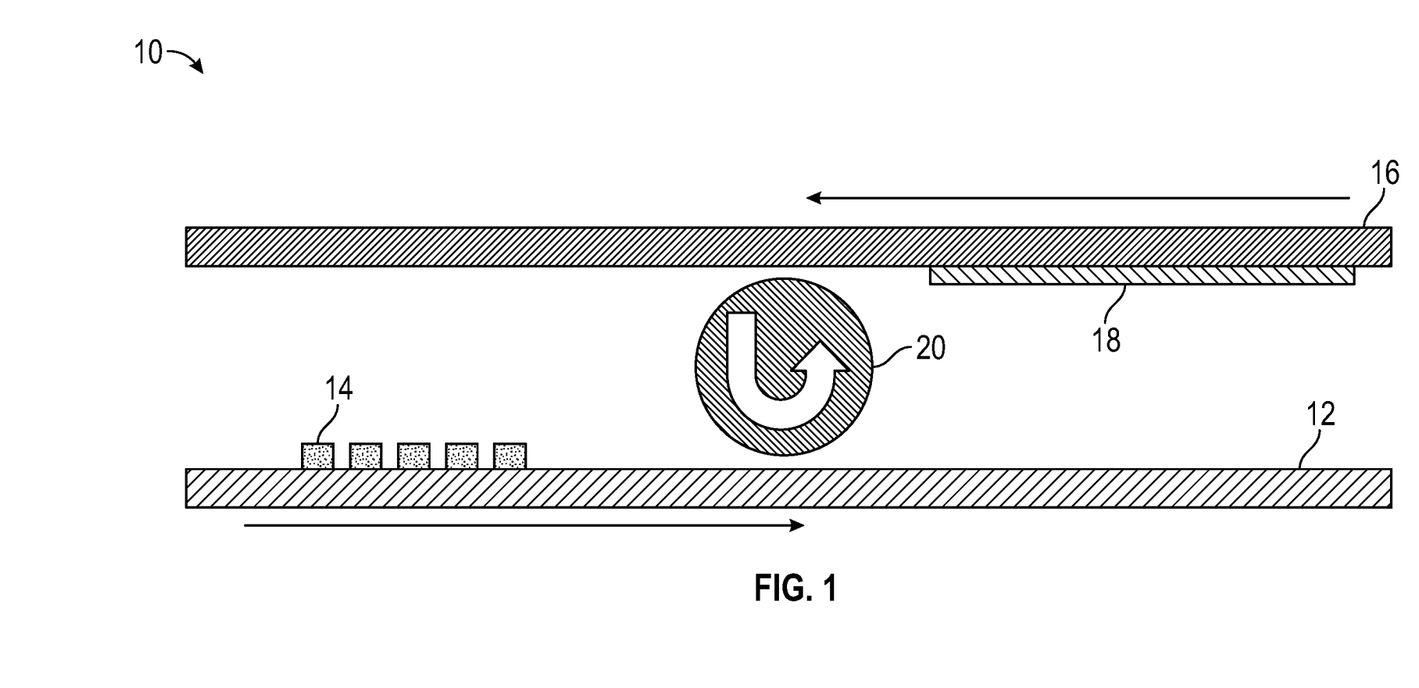
FIG. 1 is a general side view of a continuous mass transfer device using a roller feed loop according to aspects of the present disclosure.

FIG. 1 is a general side view of a continuous mass transfer device 10 using a roller feed loop according to aspects of the present disclosure. Two carrier bars are provided in a conveyor setup for movement in opposing directions, one of which is a die carrier 12 that is populated with multiple die 14 and the other is a substrate carrier 16 that includes a substrate 18. In certain embodiments, the die carrier 12, the substrate carrier 16, and a transfer element 20 are arranged on different x/y stages that are independent of one another, thereby allowing die placement that can vary laterally and/or longitudinally. The transfer element 20 may embody a structure that rotates between the die carrier 12 and the substrate carrier 16 to continuously remove die 14 from the die carrier 12 and transfer them to the substrate 18 of the substrate carrier 16. For example, in FIG. 1, the transfer element 20 is provided with a circular shape or cross-section to form a roller. As illustrated, the die carrier 12 is configured to move in a direction (left to right in FIG. 1) that is opposite to the substrate carrier 16 (right to left in FIG. 1). The transfer element 20 is arranged between the die carrier 12 and the substrate carrier 16. The transfer element 20 is configured such that the die 14 stick to the transfer element 20 and transfer from the die carrier 12 to the substrate 18 on the substrate carrier 16. The transfer element rotation speed can be configured to separate the die 14 temporally into a lateral separation on the substrate 18, for example a diced wafer tape may be loaded. As illustrated, the transfer element 20 may have a generally round shape or cross-section. As will be described later for other embodiments, the transfer element may have other shapes, such as shapes that include one or more planar surfaces. In the context of lighting display applications, the die 14 may embody LED chips or LED die and the substrate 18 may embody a substrate, board, printed circuit board, and/or panel of a display fixture.

The mass transfer device 10 of FIG. 1 may be configured to transfer various die layouts on the die carrier 12 to various die layouts on the substrate 18. Layouts may be tailored to a particular application by changing one or more of a speed at which the transfer element 20 collects the die 14, an arrangement of the die 14 on the die carrier 12, a position of the transfer element 20 with respect to the substrate 18 and combinations thereof. In certain embodiments, the transfer element 20 may remove certain ones of the die 14 from the die carrier 12 in a sequential manner. In certain embodiments, the transfer element 20 may remove sub-groupings of multiple die 14 from the die carrier 12 in a sequential manner.

Figure 2A:
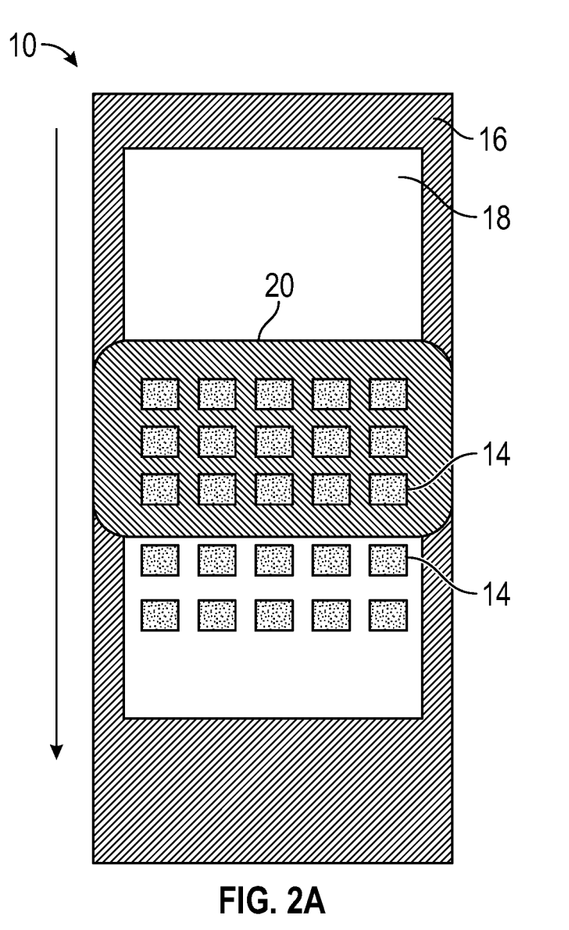
FIGS. 2A to 2C are top views illustrating various configurations of the transfer device of FIG. 1 that provide various arrangements of die on the substrate.
Figure 2B:
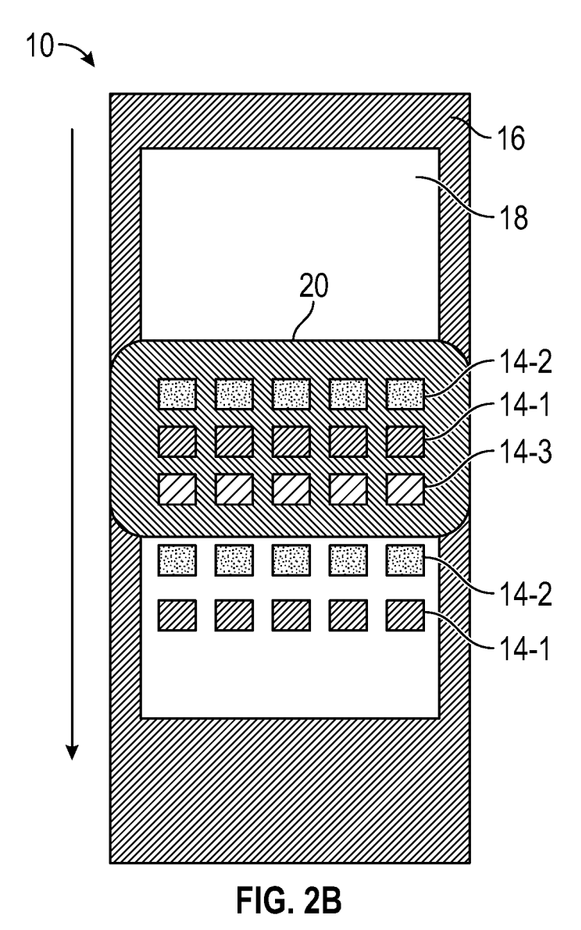
Figure 2C:
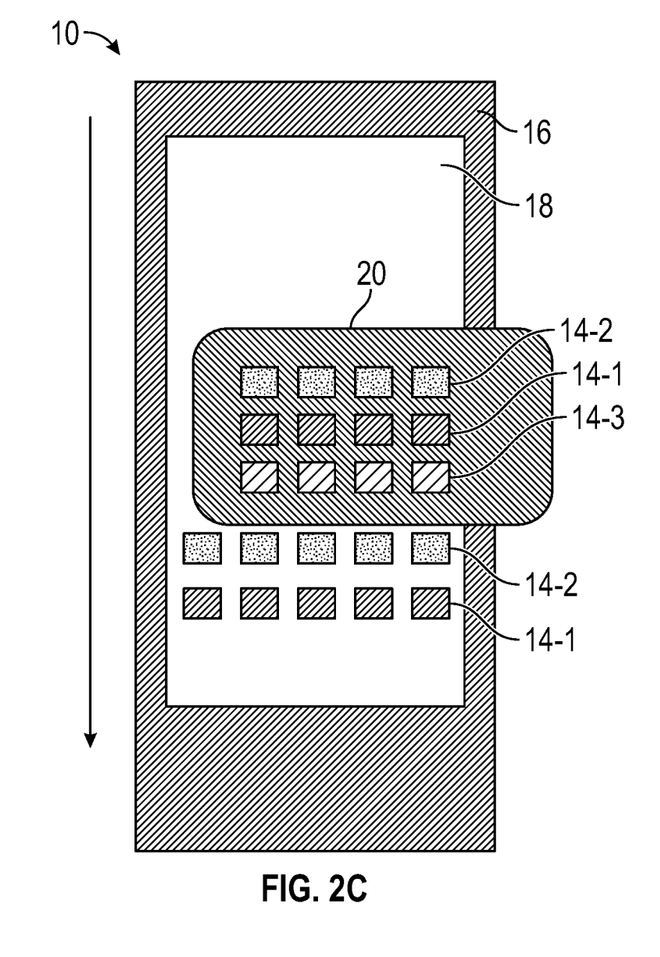

FIGS. 2A to 2C are top views illustrating various configurations of the transfer device 10 of FIG. 1 that provide various arrangements of die 14 on the substrate 18. For illustrative purposes, the die carrier 12 of FIG. 1 is not shown in order to show the arrangement of the transfer element 20 with respect to the substrate carrier 16 from the top views. The direction of movement of the substrate carrier 16 relative to the transfer element 20 is shown by a vertical downward pointing arrow in FIGS. 2A to 2C.

FIG. 2A is a top view of a first configuration of the transfer device 10 of FIG. 1. In FIG. 2A, the transfer device 10 is configured to transfer the die 14 in a grid pattern on the substrate 20. The die 14 are collected from the die carrier 12 of FIG. 1 and positioned on the transfer element 20 in a grid array or pattern. As the substrate carrier 16 traverses along the transfer element 20, the grid array of the die 14 is transferred to the substrate 18, thereby maintaining the same grid array or pattern. The position of the transfer element 20 between the die carrier 12 of FIG. 1 and the substrate carrier 16 may determine the position of the transferred pattern of the die 14. For example, in FIG. 2A, the pattern of the die 14 on the substrate 18 after transfer may have matched x/y stage position from the pattern of the die 14 before transfer. In certain embodiments, the pitch between the die 14 after transfer may be modified by changing the rotation speed of the transfer element 20 relative to the substrate 18. In certain embodiments, the die 14 may have a same die type, such as all LED chips configured to emit a same wavelength. As illustrated, the transfer element 20 may simultaneously remove multiple die 14 at a time for transfer.

FIG. 2B is a top view of a second configuration of the transfer device 10 of FIG. 1 that is similar to the first configuration of FIG. 2A except multiple types of die 14-1 to 14-3 are transferred. In FIG. 2A, the same grid array of the die 14-1 to 14-3 are transferred to the substrate 18. As shown by arrangement of the die 14-1 to 14-3 on the transfer element 20, the specific pattern of the die 14-1 to 14-3 may be collected by the transfer element 20 from the die carrier 12 of FIG. 1. By way of example, FIG. 2A illustrates an embodiment where a first row of a first type of die 14-1, a second row of a second type of die 14-2, and a third row of a third type of die 14-3 are successively transferred to the substrate 18. In certain embodiments, the pitch between the rows of the die 14-1 to 14-3 after transfer may be modified by changing the rotation speed of the transfer element relative to the substrate 18. In certain embodiments, the die 14-1 may embody an LED chip configured to emit green wavelengths of light, the die 14-2 may embody an LED chip configured to emit red wavelengths of light, and the die 14-3 may embody an LED chip configured to emit blue wavelengths of light. In this manner, FIG. 2B illustrates transfer of three die types in a grid array with matched x/y stages for the transfer element 20, the die carrier 12 of FIG. 1, and the substrate carrier 16.

FIG. 2C is a top view of a third configuration of the transfer device 10 of FIG. 1 that is similar to the second configuration of FIG. 2B except the x/y stage positions for one or more of the transfer element 20, the die carrier 12 of FIG. 1, and the substrate carrier 16 are offset from one another. By changing the offset position, the pattern of the die 14-1 to 14-3 may be arranged on the substrate 18 in a corresponding position that is offset from the initial position of the die 14-1 to 14-3 before the transfer. In certain embodiments, the offset position of one or more of the x/y stage positions may be dynamically changed during the transfer process to further alter the pattern of the die 14-1 to 14-3 on the substrate 18.

Figure 3:
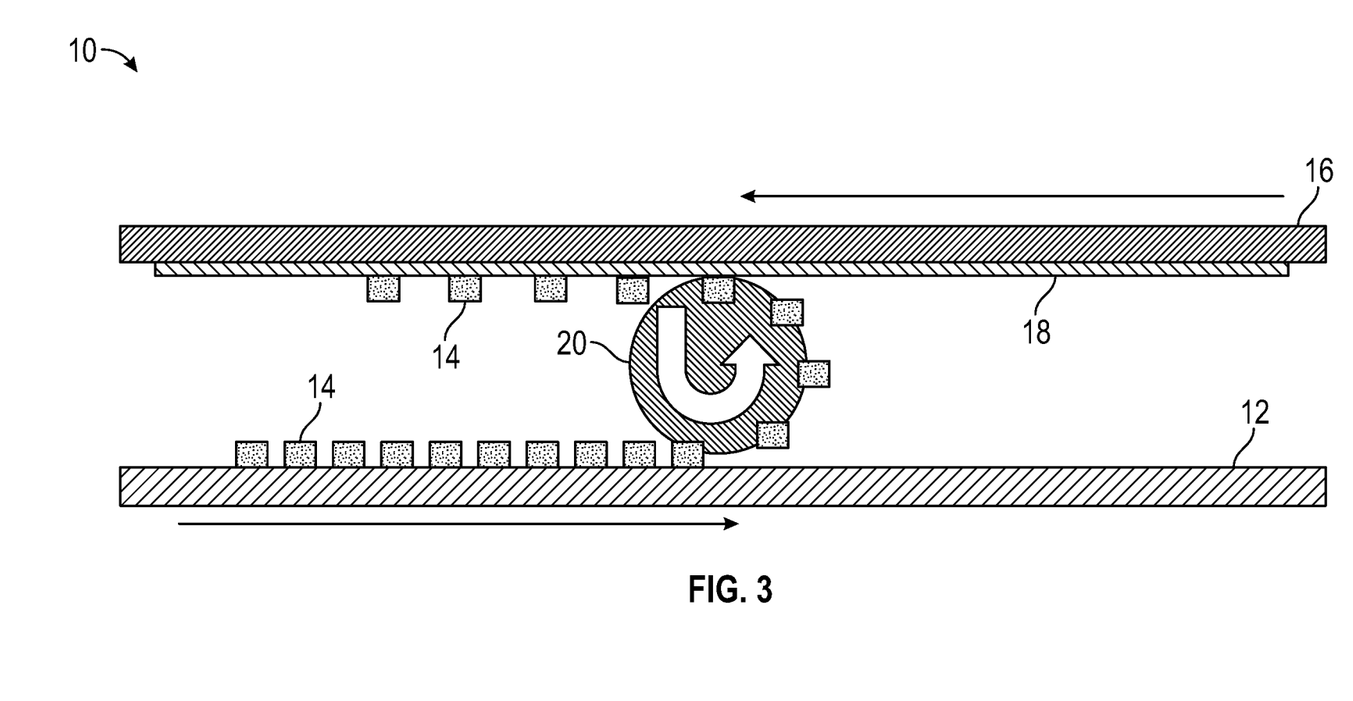
FIG. 3 is a side view of the transfer device of FIG. 1 illustrating a configuration where the pitch of the die being transferred is changed by adjusting a rotation speed of the transfer element.

FIG. 3 is a side view of the transfer device 10 of FIG. 1 illustrating a configuration where the pitch of the die 14 being transferred from the die carrier 12 to the substrate 18 is changed by adjusting a rotation speed of the transfer element 20. Since the die carrier 12, the substrate carrier 16, and the transfer element 20 may be provided on different x/y stages, rotation speeds of the transfer element 20 may be adjusted independently of the die carrier 12 and/or substrate carrier 16. In certain embodiments, the rotation speed of the transfer element 20 may be changed to alter a pattern, such as the pitch, of the die 14 being transferred. For example, if the rotation speed of the transfer element 20 is reduced relative to the substrate carrier 16, the pitch between the die 14 on the substrate 18 may be increased as illustrated in FIG. 3. If the rotation speed of the transfer element 20 is increased relative to the substrate carrier 16, the pitch between the die 14 on the substrate 18 may be decreased.

Figure 4A:
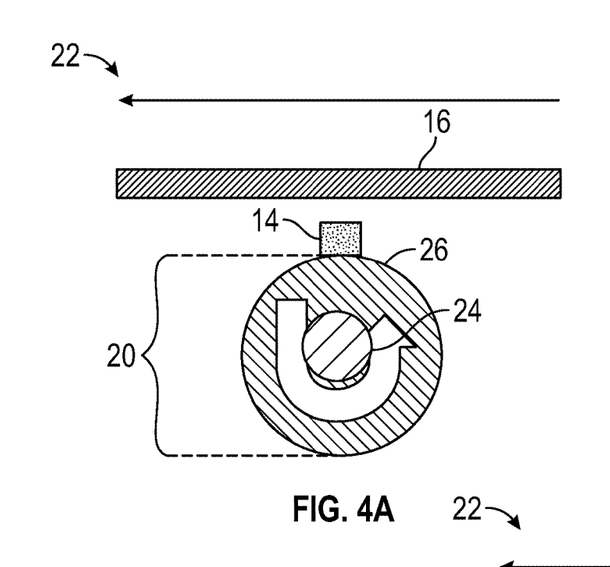
FIGS. 4A to 4C are side views of a portion of a transfer device that is similar to the transfer device of FIG. 1 where the transfer element includes a center bar and a cover that is flexible.
Figure 4B:
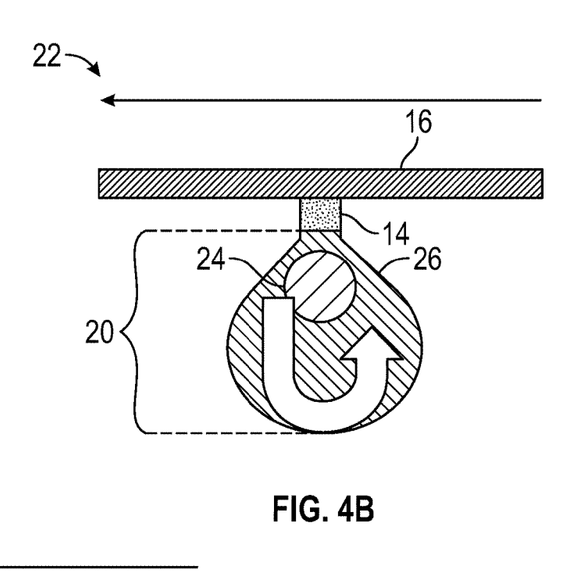
Figure 4C:
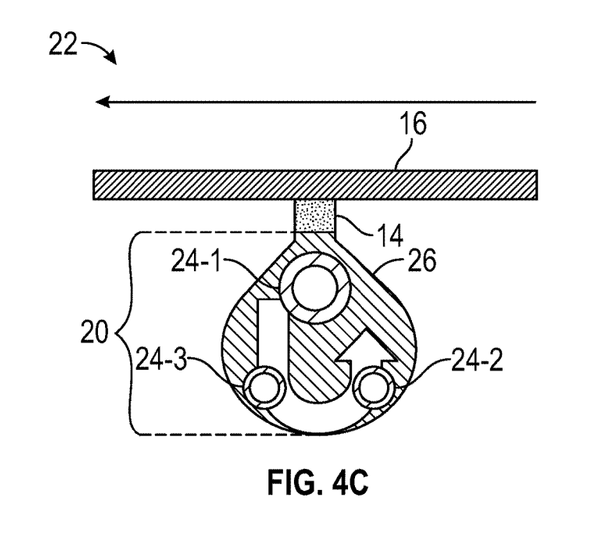

FIGS. 4A to 4C are side views of a portion of a transfer device 22 that is similar to the transfer device 10 of FIG. 1 where the transfer element 20 includes a center bar 24 and a cover 26 that is flexible. In certain embodiments, the cover 26 may comprise a flexible material, such as polyamide, polydimethylsiloxane (PDMS), silicone, and/or rubber. In FIG. 4A, the center bar 24 is positioned centrally with regard to the cover 26 and the die 14 is positioned for transfer to the substrate carrier 16. In FIG. 4B, the center bar 24 may be moved toward the substrate carrier 16 for die placement. As illustrated, the cover 26 may flex, deform, or compress during die placement before returning to its original shape when the center bar 24 is moved away from the substrate carrier 16. In certain embodiments, the center bar 24 may also be controlled by air pressure, so that increased pressure causes deformation or decreased pressure causes compression of the cover 26. For example, the center bar 24 may embody a tube that inflates and deflates with air or liquid pressure to dynamically deform the cover 26. As illustrated in FIG. 4C, multiple center bars 24-1 to 24-3 may be arranged within the cover 26, each of which embodies tubes that inflate and deflate by air or liquid pressure to transfer the die 14. While FIGS. 4A and 4B are illustrated from the context of the substrate carrier 16 when the die 14 is placed, the flexing and/or deforming of the cover 26 may also occur when the die 14 is removed from the die carrier 12 of FIG. 1. In this regard, the transfer element 20 may be configured to apply pressure to either side of the conveyor set up of the substrate carrier 16 and the die carrier 12.

Figure 5:
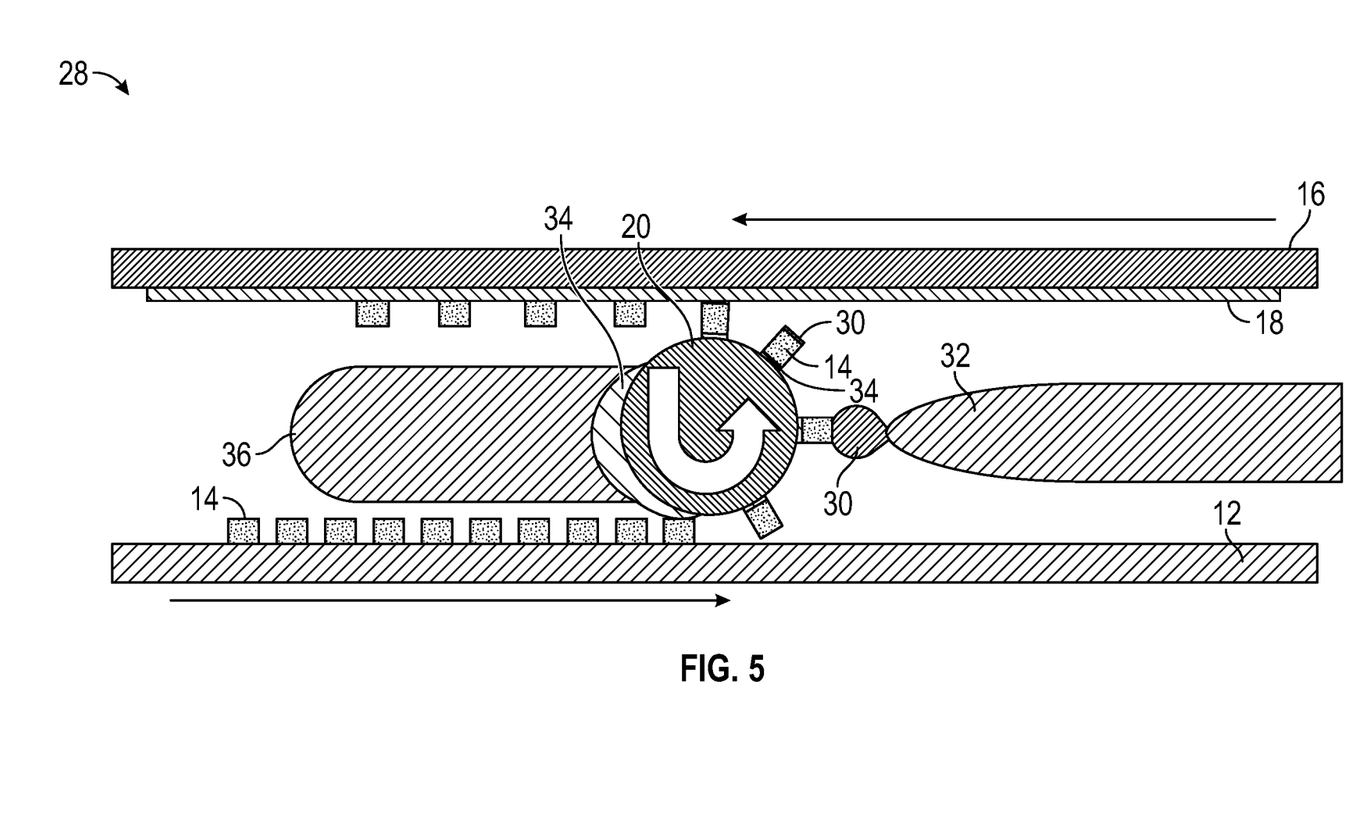
FIG. 5 is a side view of a transfer device that is similar to the transfer device of FIG. 1 and further includes additional elements that promote die adhesion and die release from the transfer element.

FIG. 5 is a side view of a transfer device 28 that is similar to the transfer device 10 of FIG. 1 and further includes additional elements that promote die adhesion and die release from the transfer element 20. In certain embodiments, a flux material 30, or adhesive material, may be applied to the transfer element 20 after the die 14 are adhered to the transfer element 20. The flux material 30 may embody die attach material for mechanically and/or electrically connecting each die 14 to the substrate 18. In the context of flip-chip LED structures, the flux material 30 may provide mechanical and electrical connections between electrodes of the LEDs and the substrate 18. In the context of lateral chips with electrodes positioned away from mounting surfaces, the flux material 30 may provide only mechanical mounting to the substrate 18. In certain embodiments, the flux material 30 comprises rosin flux. A flux applier 32 may dispense a continuous or intermittent supply of the flux material 30 to promote enhanced adhesion with the die 14 on the substrate carrier 16.

As the transfer element 20 rotates toward the die carrier 12, a die release material 34 may be provided to the transfer element 20. In certain embodiments, the die release material 34 may not be necessary, particularly if the die 14 is readily releasable due to contact with the substrate 18. The die release material 34 may comprise a material with reduced adhesion as compared to the flux material 30 to promote die release when the die 14 is rolled onto the substrate 18. The die release material 34 may have suitable adhesion to assist in removing the die 14 from the die carrier 12. In this manner, an adhesive strength between the die release material 34 and the transfer element 20 may be less than an adhesive strength between the die 14 and the substrate 18. When the die release material 34 is present, the die 14 may be adhered to the transfer element 20 by the die release material 34 and may also have the flux material 30 on an opposing side of the die just before transfer to the substrate 18. A die release applier 36 may serve to dispense a continuous or intermittent supply of the die release material 34, depending on the embodiment. In certain embodiments, the die release material 34 may comprise a temperature dependent adhesive such that differences in temperatures between the transfer element 20 and the die carrier 12 or between the transfer element 20 and the substrate carrier 16 may control adhesion and release of the die 14. For example, at a first temperature of the transfer element 20 or die carrier 12, the die release material 34 may adhere to the die 14 and remove the die 14 from the die carrier 12. At a second temperature of the substrate carrier 16, the die release material 34 may have reduced adhesion so that the die 14 is transferred to the substrate 18. In still further embodiments, adhesion of the die release material 34 may be controlled by ultraviolet exposure in a similar manner described above for temperature.

Figure 6A:
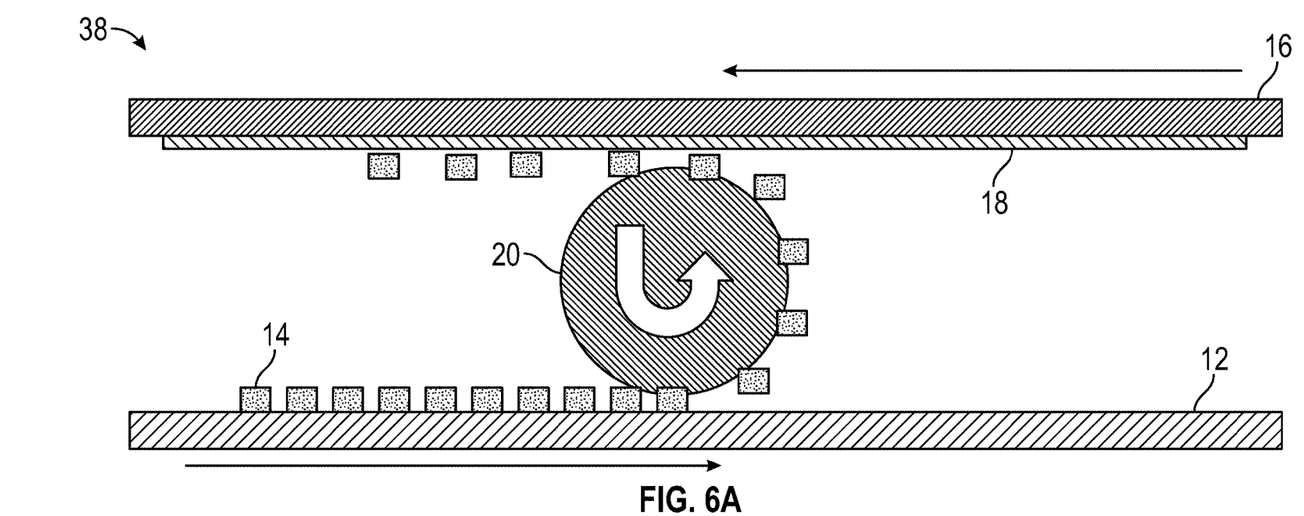
FIGS. 6A and 6B are side views of a transfer device that is similar to the transfer device of FIG. 1 and where the transfer element is configured to be able to change sizes for adjusting a pitch of the die on the substrate.
Figure 6B:
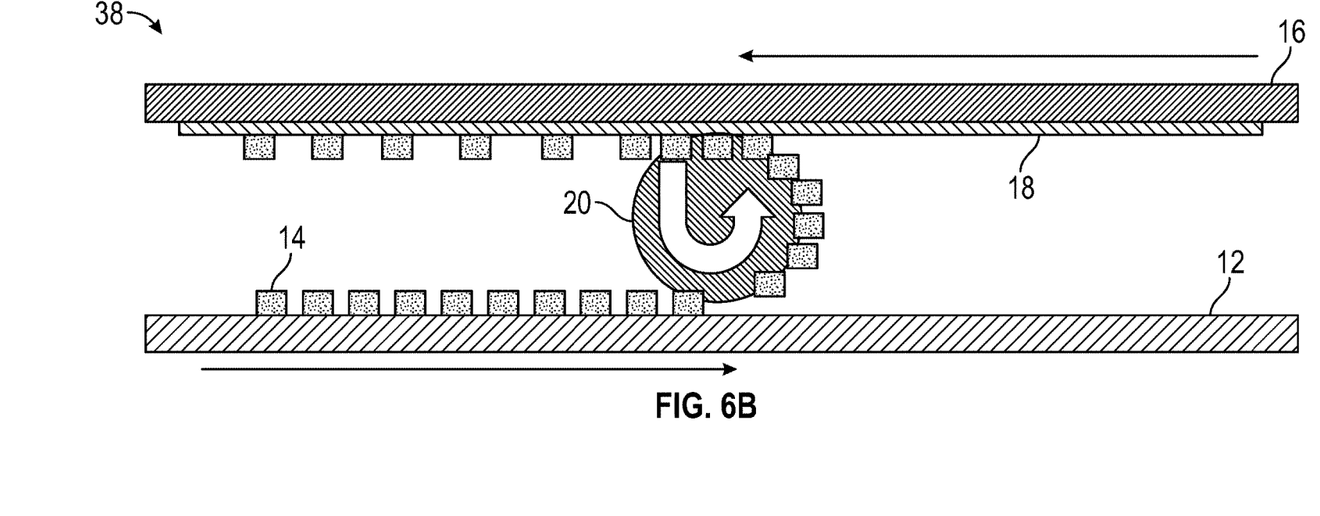

FIGS. 6A and 6B are side views of a transfer device 38 that is similar to the transfer device 10 of FIG. 1 and where the transfer element 20 is configured to be able to change sizes for adjusting a pitch of the die 14 on the substrate 18. In FIG. 6A, the transfer element 20 has a generally larger diameter, and the pitch of the die 14 on the transfer element 20 and transferred to the substrate 18 is generally larger than the pitch of the die 14 while still on the die carrier 12. In FIG. 6B, the diameter of the transfer element 20 is reduced such that the pitch of the die 14 on the transfer element 20 and transferred to the substrate 18 is reduced from that of FIG. 6A. In certain embodiments, the size or diameter of the transfer element 20 is configured to be changed during mass die transfer. In this regard, the fabrication sequence of FIG. 6B illustrates a successive step to FIG. 6A such that the pitch of the die 14 on the substrate 18 may be dynamically changed during the mass transfer sequence. In certain embodiments, the transfer element 20 comprises an inflatable structure that can be inflated and/or deflated during transfer to dynamically tune the die pitch on the substrate 18. As such, the transfer element 20 may be referred to as an expandable transfer element or expandable roller. The inflatable structure may be formed by supplying or removing gas and/or liquid within the transfer element 20 to inflate and/or deflate the structure on demand.

Figure 7:
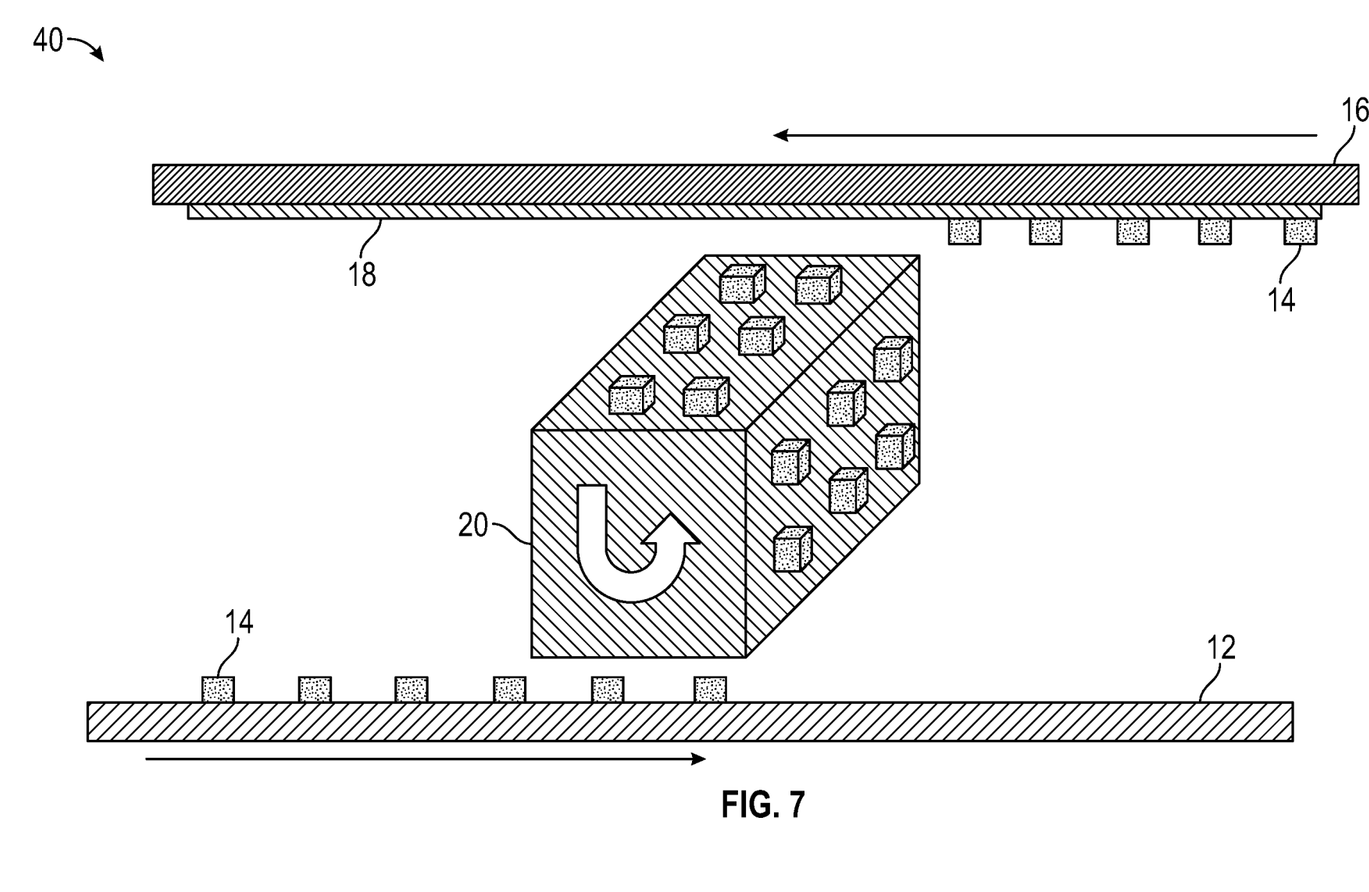
FIG. 7 is a side view of a transfer device that is similar to the transfer device of FIG. 1 and where the transfer element is arranged with one or more planar surfaces.

FIG. 7 is a side view of a transfer device 40 that is similar to the transfer device 10 of FIG. 1 and where the transfer element 20 is arranged with one or more planar surfaces. For example, in FIG. 7, the transfer element 20 is provided with rectangular shape for a cross-section, thereby forming four planar surfaces that may be employed to transfer the die 14 from the die carrier 12 to the substrate carrier 16. In certain embodiments, the planar or flat surfaces may promote simultaneous transfer of multiple die 14. For example, in a single step, a flat surface of the transfer element 20 may contact and remove an array of the die 14 from the die carrier 12. The transfer element 20 may then rotate to eventually position the array of the die 14 for simultaneous transfer to the substrate 18. With each rotation, the transfer element 20 may rotate 90 degrees to select more die 14 from die carrier 12, while also transferring die 14 on an opposing flat surface of the transfer element 20 to the substrate 18. In certain embodiments, the flat surfaces of the transfer element 20 may improve die adhesion by allowing time for the transfer element 20 to pause when contacting the die 14 on the die carrier 12. Additionally, the ability of the transfer element 20 to pause at different steps, rather than continuously rolling as in previous embodiments, allows time to may positional adjustments and/or alignments during transfer.

Figure 8:
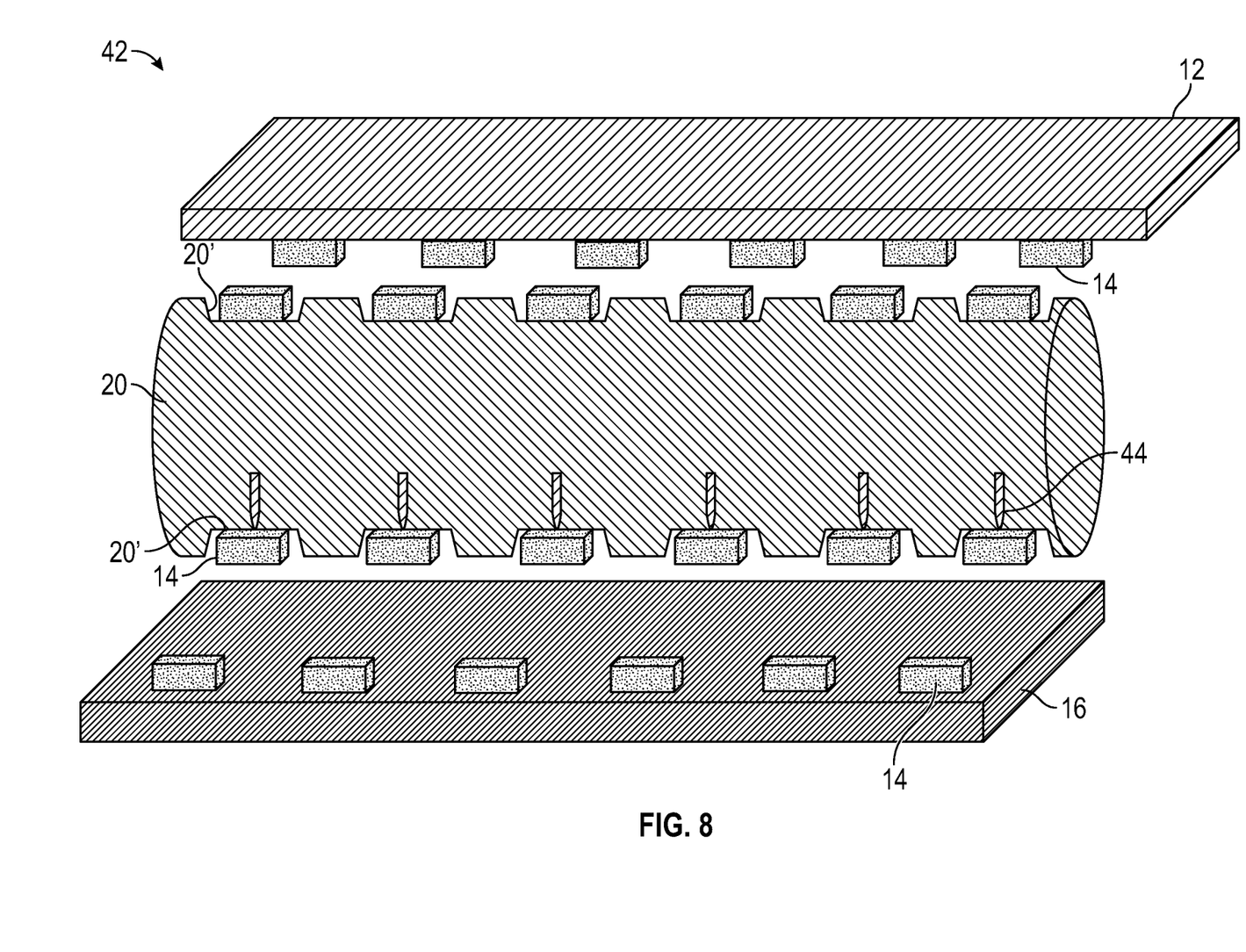
FIG. 8 is a perspective view of a transfer device that is similar to the transfer device of FIG. 1 and where the transfer element is arranged with one or more alignment pockets for transferring the die.

FIG. 8 is a perspective view of a transfer device 42 that is similar to the transfer device 10 of FIG. 1 and where the transfer element 20 is arranged with one or more alignment pockets 20' for transferring the die 14. In FIG. 8, the orientation of the die carrier 12 and the substrate carrier 16 is reversed from previous embodiments. However, it is understood the orientation of the die carrier 12 and the substrate carrier 16 could be the same as previous embodiments without deviating from the principles disclosed. The alignment pockets 20' are formed in the transfer element 20, and the die 14 are collected from the die carrier 12 with a spacing as determined by a spacing of the alignment pockets 20'. In this manner, the transfer element 20 is arranged to self-align the die 14 being transferred. The transfer element 20 may then rotate to position the die 14 for transferring to the substrate carrier 16. In certain embodiments, an ejector pin 44 may be provided to release the die 14 from the transfer element 20 onto the substrate carrier 16.

It is contemplated that any of the foregoing aspects, and/or various separate aspects and features as described herein, may be combined for additional advantage. Any of the various embodiments as disclosed herein may be combined with one or more other disclosed embodiments unless indicated to the contrary herein.

Those skilled in the art will recognize improvements and modifications to the preferred embodiments of the present disclosure. All such improvements and modifications are considered within the scope of the concepts disclosed herein and the claims that follow.

What is claimed is:

1. A method for transfer of a semiconductor die, the method comprising:
   providing a die carrier with the semiconductor die on a surface of the die carrier;
   providing a substrate carrier with a substrate on a surface of the substrate carrier;
   providing a transfer element between the die carrier and the substrate carrier; and
   transferring the semiconductor die from the die carrier to the substrate by rotating the transfer element such that the transfer element removes the semiconductor die from the die carrier, rotates the semiconductor die away from the die carrier, and transfers the semiconductor die to the substrate, wherein the die carrier moves in a first direction relative to the transfer element and the substrate carrier moves in a second direction relative to the transfer element, wherein the first direction is opposite the second direction.

2. The method of claim 1, wherein the semiconductor die comprises a light-emitting diode (LED) chip.

3. The method of claim 1, wherein the transfer element comprises a roller.

4. The method of claim 1, wherein the transfer element comprises a flexible roller.

5. The method of claim 1, wherein the transfer element comprises an expandable roller.

6. The method of claim 1, further comprising applying a flux material to the transfer element before the semiconductor die is removed from the die carrier.

7. The method of claim 6, further comprising applying a die release material to the transfer element before the semiconductor die is transferred to the substrate.

8. The method of claim 1, wherein the transfer element comprises a flat surface.

9. The method of claim 1, wherein the semiconductor die is one of a plurality of semiconductor die on the die carrier and the transfer element removes at least two semiconductor die at the same time.

10. The method of claim 1, wherein the transfer element comprises an alignment pocket and the semiconductor die resides within the alignment pocket after being removed from the die carrier.

11. The method of claim 1, wherein the transfer element comprises an ejector pin that releases the semiconductor die from the transfer element to the substrate.

12. A method for transfer of a semiconductor die, the method comprising:
providing a die carrier with a plurality of semiconductor die on a surface of the die carrier;
providing a substrate carrier with a substrate on a surface of the substrate carrier;
providing a transfer element between the die carrier and the substrate carrier; and
transferring the plurality of semiconductor die from the die carrier to the substrate by rotating the transfer element such that the transfer element removes the plurality of semiconductor die from the die carrier, rotates the plurality of semiconductor die away from the die carrier, and transfers the plurality of semiconductor die to the substrate, wherein the plurality of semiconductor die are arranged in subgroupings on the die carrier and the transfer element removes the subgroupings in a sequential manner.

13. The method of claim 12, wherein the subgroupings comprise patterns of the semiconductor die that are transferred from the die carrier to the substrate.

14. The method of claim 12, wherein:
the plurality of semiconductor die comprise light-emitting diode (LED) chips; and
each subgrouping comprises LED chips that emit different wavelengths from one another.

15. The method of claim 12, wherein the plurality of semiconductor die are arranged with a first pitch on the die carrier and the plurality of semiconductor die are transferred to the substrate with a second pitch that is different than the first pitch.

16. The method of claim 12, wherein the transfer element comprises a roller.

17. The method of claim 12, further comprising applying a flux material to the transfer element after the plurality of semiconductor die are removed from the die carrier.

18. The method of claim 17, further comprising applying a die release material to the transfer element before the plurality of semiconductor die are removed from the die carrier.

19. The method of claim 18, wherein an adhesive strength between the die release material and the transfer element is less than an adhesive strength between the die and the substrate.

20. The method of claim 12, wherein the transfer element comprises a plurality of alignment pockets and at least one semiconductor die of the plurality of semiconductor die resides within each alignment pocket of the plurality of alignment pockets after being removed from the die carrier.

21. The method of claim 12, wherein the transfer element comprises one or more ejector pins that release the plurality of semiconductor die from the transfer element to the substrate.

22. A method for transfer of a semiconductor die, the method comprising:
providing a die carrier with the semiconductor die on a surface of the die carrier;
providing a substrate carrier with a substrate on a surface of the substrate carrier;
providing a transfer element between the die carrier and the substrate carrier; and
transferring the semiconductor die from the die carrier to the substrate by rotating the transfer element such that the transfer element removes the semiconductor die from the die carrier, rotates the semiconductor die away from the die carrier, and transfers the semiconductor die to the substrate, wherein the semiconductor die is one of a plurality of semiconductor die on the die carrier and the transfer element removes at least two semiconductor die at the same time.

* * * * *